(12) United States Patent
Chen

(10) Patent No.: US 12,441,697 B2
(45) Date of Patent: Oct. 14, 2025

(54) CROSSLINKING LIGAND, METHOD FOR PATTERNING NANOPARTICLE LAYER, QUANTUM DOT LIGHT-EMITTING DEVICE, AND DISPLAY DEVICE

(71) Applicants: Beijing BOE Technology Development Co., Ltd., Beijing (CN); BOE Technology Group Co., Ltd., Beijing (CN)

(72) Inventor: Zhuo Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1101 days.

(21) Appl. No.: 17/429,931

(22) PCT Filed: Feb. 20, 2021

(86) PCT No.: PCT/CN2021/077067
§ 371 (c)(1),
(2) Date: Aug. 10, 2021

(87) PCT Pub. No.: WO2021/164768
PCT Pub. Date: Aug. 26, 2021

(65) Prior Publication Data
US 2023/0140861 A1    May 11, 2023

(30) Foreign Application Priority Data
Feb. 21, 2020 (CN) .......................... 20201010671.9

(51) Int. Cl.
*C07C 59/84* (2006.01)
*B82Y 40/00* (2011.01)
(Continued)

(52) U.S. Cl.
CPC ............ *C07D 303/34* (2013.01); *B82Y 40/00* (2013.01); *C07C 59/84* (2013.01); *C07C 321/30* (2013.01);
(Continued)

(58) Field of Classification Search
CPC ....... C09K 11/02; C09K 11/025; C07C 59/84; C07C 321/30; C07C 323/19;
(Continued)

(56) References Cited

U.S. PATENT DOCUMENTS

2002/0176849 A1* 11/2002 Slepian ................. A61M 25/00
514/8.4
2011/0226995 A1*  9/2011 Tulsky .................. B82Y 15/00
252/301.36
(Continued)

FOREIGN PATENT DOCUMENTS

CN    102239108 A    11/2011
CN    106406027 A     2/2017
(Continued)

OTHER PUBLICATIONS

CN 2020101067199 first office action.
PCT/CN2021/077067 international search report and written opinion.

Primary Examiner — Matthew E. Hoban
Assistant Examiner — Lynne Edmondson
(74) Attorney, Agent, or Firm — IPro, PLLC

(57) ABSTRACT

The present disclosure relates to a crosslinking ligand, a method for patterning a nanoparticle layer, a quantum dot light-emitting device, and a display device. The crosslinking ligand includes: at least two coordinating groups, at least one photosensitive degradation group and at least one thermosensitive crosslinking group, both of which are connected between the coordinating groups. The method for patterning the nanoparticle layer includes: forming a nanoparticle layer (Continued)

on a substrate; attaching a solution containing the crosslinking ligand to the substrate, to allow the crosslinking ligand to form a crosslinking between nanoparticles; performing a light irradiation treatment on a preset region of the substrate; removing the nanoparticles in the preset region; and performing a heat treatment on the substrate. The present disclosure does not need to design the structure of the ligand of the nanoparticles, and can form a nanoparticle layer with high resolution, simple process and high realizability.

19 Claims, 3 Drawing Sheets

(51) Int. Cl.
| | |
|---|---|
| *C07C 321/30* | (2006.01) |
| *C07C 323/19* | (2006.01) |
| *C07C 323/22* | (2006.01) |
| *C07D 303/34* | (2006.01) |
| *C09K 11/02* | (2006.01) |
| *G03F 7/004* | (2006.01) |
| *H10K 50/115* | (2023.01) |
| *H10K 71/00* | (2023.01) |
| *H10K 71/20* | (2023.01) |
| *H10K 71/40* | (2023.01) |

(52) U.S. Cl.
CPC .......... *C07C 323/19* (2013.01); *C07C 323/22* (2013.01); *C09K 11/02* (2013.01); *G03F 7/004* (2013.01); *H10K 71/00* (2023.02); *H10K 71/40* (2023.02)

(58) Field of Classification Search
CPC .... C07C 323/22; C07C 323/16; H10K 71/40; H10K 71/211; H10K 71/20; H10K 50/115; H10K 85/60; G03F 7/004; G03F 7/039; C07D 303/34; B82Y 40/00; B82Y 30/00
See application file for complete search history.

(56) References Cited

U.S. PATENT DOCUMENTS

| | | | |
|---|---|---|---|
| 2012/0040397 A1* | 2/2012 | Luo | ............... C12N 15/10 435/68.1 |
| 2019/0207136 A1 | 7/2019 | Chen et al. | |
| 2020/0127219 A1 | 4/2020 | Chen et al. | |
| 2021/0388259 A1 | 12/2021 | Mei et al. | |

FOREIGN PATENT DOCUMENTS

| | | |
|---|---|---|
| CN | 108172603 A | 6/2018 |
| CN | 109378395 A | 2/2019 |
| CN | 110590549 A | 12/2019 |
| CN | 111909683 A | 11/2020 |

* cited by examiner

| Graphics | Quantum dots |
|---|---|
|  | Red quantum dots |
|  | Green quantum dots |
|  | Blue quantum dots |

CROSSLINKING LIGAND, METHOD FOR PATTERNING NANOPARTICLE LAYER, QUANTUM DOT LIGHT-EMITTING DEVICE, AND DISPLAY DEVICE

CROSS-REFERENCE TO RELATED APPLICATION

This application is the U.S. national phase of PCT Application No. PCT/CN2021/077067 filed on Feb. 21, 2020, which claims a priority to Chinese Patent Application No. 202010106719.9 filed on Feb. 21, 2020, the disclosures of which are incorporated in their entirety by reference herein.

TECHNICAL FIELD

The present disclosure relates to the field of display technology, in particular to a crosslinking ligand, a method for patterning a nanoparticle layer using the crosslinking ligand, and a quantum dot light-emitting device and a display device prepared using the crosslinking ligand.

BACKGROUND

With the in-depth development of quantum dot preparation technology, the stability of quantum dots and the luminous efficiency of quantum dots have been continuously improved. Quantum light-emitting diode (QLED) has an increasingly bright application prospect in the field of display technology. However, the current high-resolution (>300 ppi) patterning technology of QLED has not made a breakthrough, which hinders the commercialization of QLED.

Quantum dots are zero-dimensional nano-semiconductor materials, and the dimensions of quantum dots in three dimensions are not greater than twice the Bohr radius of the exciton of the corresponding semiconductor material. In the preparing a patterned quantum dot layer, due to the inorganic nanoparticle properties of quantum dots, it is impossible to produce a patterned quantum dot layer by vapor deposition film formation and patterning methods. The related technology also uses inkjet printing to make patterned quantum dot layers, but it is difficult to achieve higher resolution by this method. Other inorganic nanoparticles with similar properties to quantum dots also cannot form a patterned high-resolution film layer according to the above technology.

It is a feasible solution to use a photolithography process to achieve high-resolution patterning of the nanoparticle layer. However, most of the current photolithography processes are designed and improved on the structure of the ligand of the nanoparticles, and the synthesis method is complicated and the synthesis is difficult.

SUMMARY

In one aspect, the present disclosure provides a crosslinking ligand, including at least two coordinating groups, at least one photosensitive degradation group and at least one thermosensitive crosslinking group, both of which are connected between the coordinating groups.

Optionally, the crosslinking ligand includes at least one first coordinating group and at least one second coordinating group arranged at both ends, and in which a first photosensitive degradation group, a first thermosensitive crosslinking group, and a second photosensitive degradation group are sequentially connected between the first coordinating group and the second coordinating group; a first thermosensitive crosslinking group, a first photosensitive degradation group, a second photosensitive degradation group, and a second thermosensitive crosslinking group are sequentially connected between the first coordinating group and the second coordinating group; a first thermosensitive crosslinking group, a first photosensitive degradation group, and a second thermosensitive crosslinking group are sequentially connected between the first coordinating group and the second coordinating group; or a first photosensitive degradation group is connected between the first coordinating group and the second coordinating group, at least one first thermosensitive crosslinking group is connected to a branch between the first coordinating group and the first photosensitive degradation group, and at least one second thermosensitive crosslinking group is connected to a branch between the second coordinating group and the first photosensitive degradation group.

Optionally, the photosensitive degradation group is any one of benzoyl, o-nitrobenzyloxy, benzyloxy acetal or coumarin group; the thermosensitive crosslinking group includes phenyl sulfide, epoxy, a carbon double bond-containing group, acrylate or methacrylate; and the coordinating groups are selected from any one of alkylphosphine group, alkyl oxyphosphine group, carboxyl, mercapto, and amino.

Optionally, the crosslinking ligand is a ligand represented by any one of formula (I) to formula (VII):

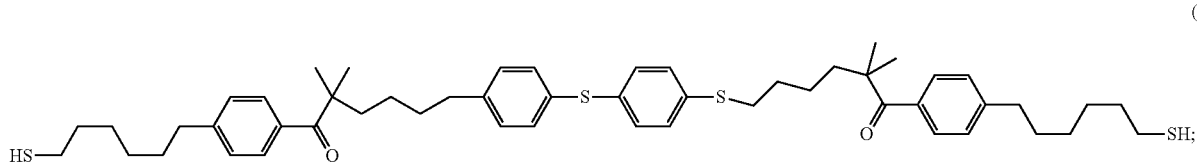

(I)

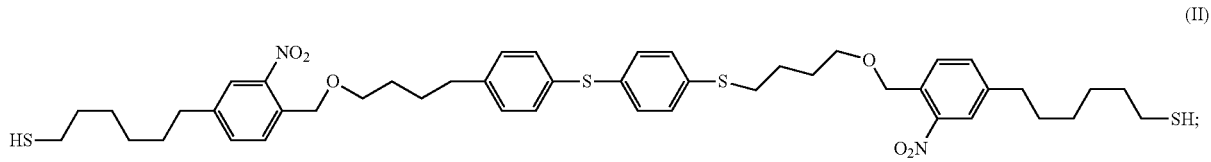

(II)

-continued

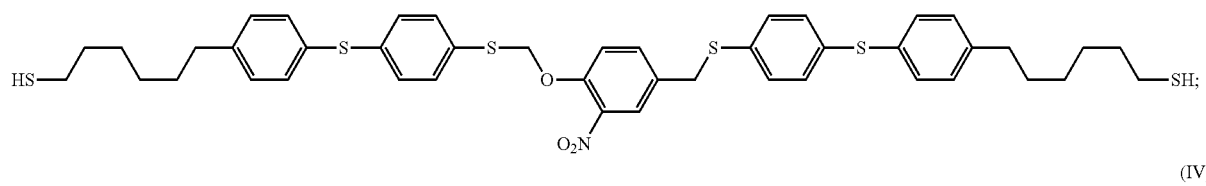
(III)

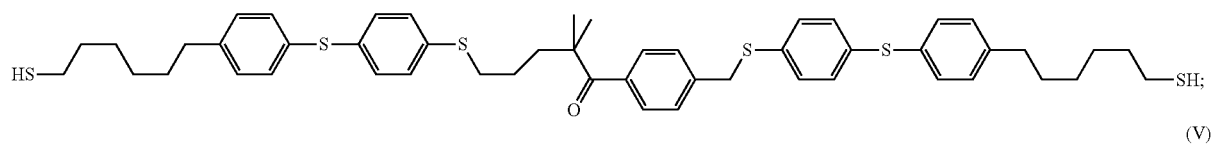
(IV)

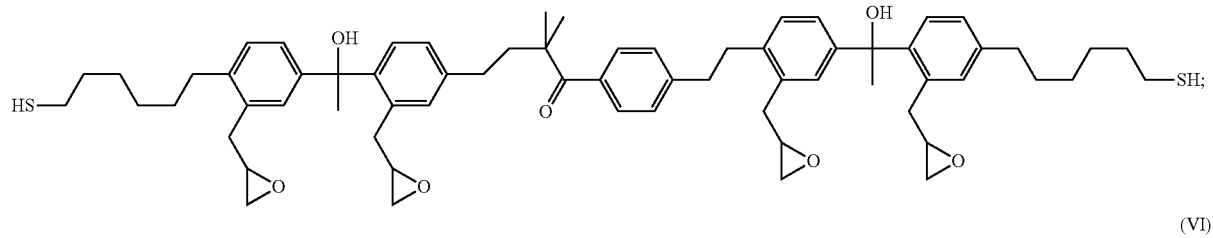
(V)

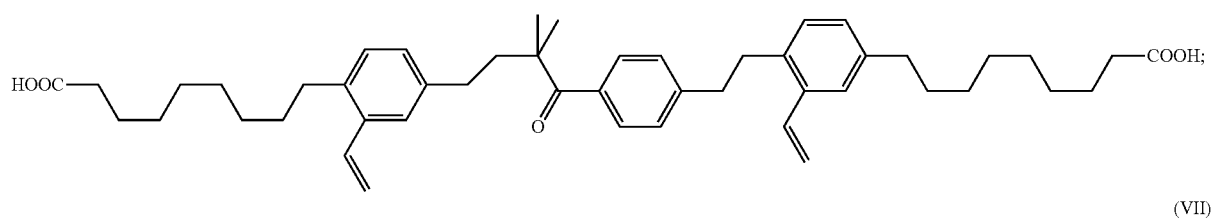
(VI)

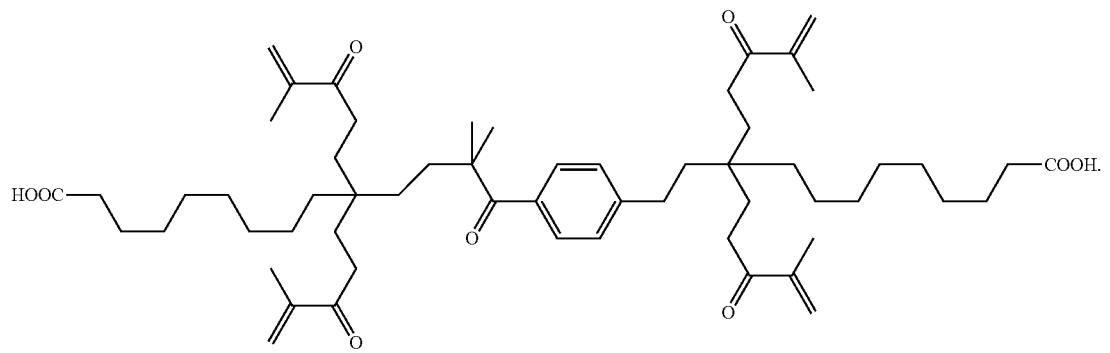
(VII)

In another aspect, the present disclosure provides a method for patterning a nanoparticle layer, including steps of: forming a nanoparticle layer on a substrate; attaching a solution containing the crosslinking ligand described in the above technical solutions to the substrate uniformly, to allow the crosslinking ligand to form a crosslinking between nanoparticles; performing a light irradiation treatment on a preset region of the substrate, to degrade the crosslinking ligand in the preset region, thereby releasing the crosslinking between the nanoparticles; removing the nanoparticles in the predetermined region; and performing a heat treatment on the substrate, to form a crosslinking between the thermosensitive crosslinking groups in the crosslinking ligands, thereby completing the patterning of the nanoparticle layer.

Optionally, the nanoparticle layer is a quantum dot layer.

Optionally, the above steps are repeated to form a plurality of quantum dot layers capable of emitting light of different colors on the substrate.

Optionally, the light used in the light irradiation treatment has a wavelength in a range from 300 to 400 nm; and the heat treatment is performed at a temperature in a range from 100 to 150° C., and the heat treatment is performed for a time period in a range from 10 to 30 min.

The present disclosure provides a method for preparing a quantum dot light-emitting device, including forming an anode, a quantum dot layer and a cathode, in which the quantum dot layer is prepared by the method described in the above technical solutions.

The present disclosure provides a quantum dot light-emitting device prepared by the method for preparing the quantum dot light-emitting device described in the above technical solution.

The present disclosure also provides a display device, including the quantum dot light-emitting device described in the above technical solution.

The crosslinking ligand of the present disclosure and the method for preparing the nanoparticle layer patterning of the present disclosure have the following beneficial technical effects:

By using the crosslinking ligand of the present disclosure and the patterning method of the crosslinking ligand, existing nanoparticles or quantum dots can be used to form a nanoparticle layer or a quantum dot layer, without involving the design and change of the ligand of the nanoparticles or quantum dots, thereby reducing the difficulty of synthesis of nanoparticles or quantum dots. Moreover, the method for patterning a nanoparticle layer according to the present disclosure can use glue coating and photolithography equipment in the production of display backplanes (or even IC), and can form a nanoparticle layer or quantum dot layer with high resolution and good performance.

DETAILED DESCRIPTION

In order to better understand the present disclosure, the embodiments of the present disclosure will be described below in combination with detail Examples, but it should be understood that these descriptions are merely used to further illustrate the features and advantages of the present disclosure and are not intended to limit the protection scope of the present disclosure.

In the related art, using a photolithography process to achieve high-resolution patterning of the quantum dot layer is a feasible solution. At present, the photolithography process of the quantum dot layer is mainly performed on the structural design of the quantum dot ligands, which can be roughly divided into three schemes: the first one is that the ligands are separated after light irradiation, so that the solubility of the quantum dots in the light-irradiated region is reduced, and the quantum dots are retained in the light-irradiated region; the second one is that the crosslinkable ligand is light-irradiated, the ligand is crosslinked after the light irradiation, thereby fixing the quantum dot in the light-irradiated region (similar to the positive photoresist in the photolithography process); and the third one is that the ligand is degraded through light irradiation, the quantum dot ligand is in a crosslinked state before the light irradiation, and the ligand is degraded after the light irradiation, so that the ligand can be washed away by the solvent. In the first solution mentioned above, the separation of the ligand from the surface of the quantum dot shell will increase the defects of the quantum dot and affect the efficiency of the device. In the latter two solutions, a complex ligand structure and a ligand exchange process are required, and there is a higher difficulty in material synthesis.

In response to the above technical problems, the present disclosure provides a crosslinking ligand and a method for patterning nanoparticles using the crosslinking ligand. The method for patterning nanoparticles does not require complex structure design of the ligand of the nanoparticle, to form a nanoparticle or quantum dot layer with high resolution. The method is simple in process and highly feasible.

According to an embodiment of the present disclosure, there is provided a crosslinking ligand, including at least two coordinating groups, at least one photosensitive degradation group and at least one thermosensitive crosslinking group, both of which are connected between the coordinating groups.

Figure 1:
FIG. 1 is a schematic view showing the structure of a crosslinking ligand according to a first embodiment of the present disclosure.

Specifically, the structure of the crosslinking ligand according to the present disclosure is shown in FIG. 1. The crosslinking ligand includes at least two coordinating groups 1 and 1', at least one photosensitive degradation group 2 and at least one thermosensitive crosslinking group 3, both of which are connected between the coordinating groups.

In an embodiment of the present disclosure, the coordinating group is connected to the nanoparticles to form a cross-linked structure. After the photosensitive degradation group is irradiated with light, it breaks and degrades the crosslinking ligand. The thermosensitive crosslinking group can reform crosslinking after being heated, and play a role in stabilizing the nanoparticle layer. The photosensitive degradation group is any one of benzoyl, o-nitrobenzyloxy, benzyloxy acetal or coumarin group; the thermosensitive crosslinking group includes phenyl sulfide, epoxy, a carbon double bond-containing group, acrylate or methacrylate; and the coordinating groups may be selected from any one of alkylphosphine group, alkyl oxyphosphine group, carboxyl, mercapto, and amino. The groups may be connected directly or through a carbon chain or a carbon chain containing substituents. The carbon chain may be a saturated carbon chain or an unsaturated carbon chain. The saturated carbon chain may be a linear or branched alkylene.

Figure 2:
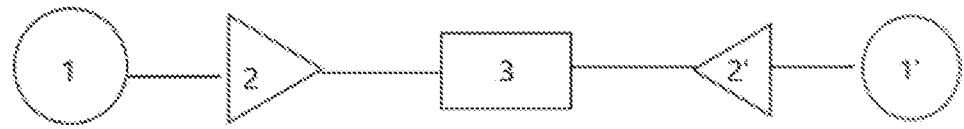
FIG. 2 is a schematic view showing the structure of a crosslinking ligand according to a second embodiment of the present disclosure.
Figure 3:
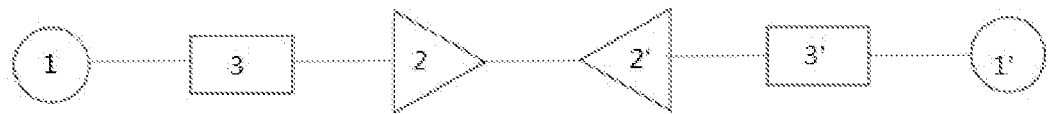
FIG. 3 is a schematic view showing the structure of a crosslinking ligand according to a third embodiment of the present disclosure.
Figure 4:
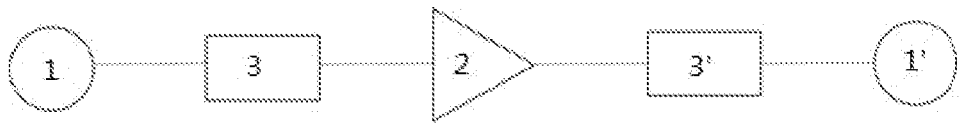
FIG. 4 is a schematic view showing the structure of a crosslinking ligand according to the fourth embodiment of the present disclosure.
Figure 5:
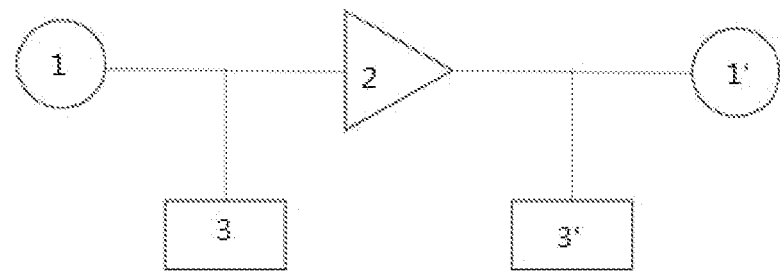
FIG. 5 is a schematic view showing the structure of a crosslinking ligand according to the fifth embodiment of the present disclosure.
Figure 6:
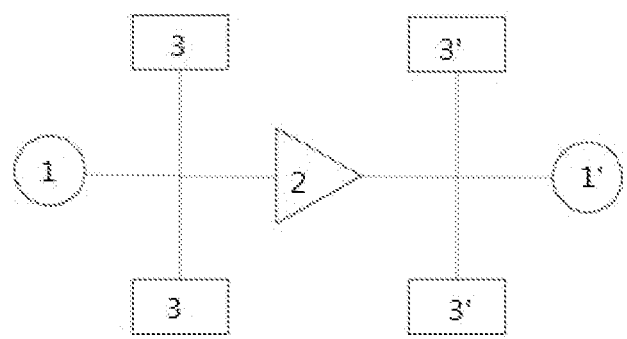
FIG. 6 is a schematic view showing the structure of a crosslinking ligand according to the sixth embodiment of the present disclosure.

Optionally, the crosslinking ligand includes a coordinating group 1 and a second coordinating group 1' arranged at both ends, and FIGS. 2 to 6 respectively show embodiments in which a first coordinating group and a second coordinating group are arranged at both ends. As shown in FIG. 2, a first photosensitive degradation group 2, a first thermosensitive crosslinking group 3, and a second photosensitive degradation group 2' are sequentially connected between the first coordinating group 1 and the second coordinating group V. As shown in FIG. 3, a first thermosensitive crosslinking group 3, a first photosensitive degradation group 2, a second photosensitive degradation group 2', and a second thermosensitive crosslinking group 3' are sequentially connected between the first coordinating group 1 and the second coordinating group 1'. As shown in FIG. 4, a first thermosensitive crosslinking group 3, a first photosensitive degradation group 2, and a second thermosensitive crosslinking group 3' are sequentially connected between the first coordinating group 1 and the second coordinating group F. As shown in FIG. 5 and FIG. 6, a first photosensitive degradation group 2 is connected between the first coordinating group 1 and the second coordinating group 1', at least one first thermosensitive crosslinking group 3 is connected to a branch between the first coordinating group 1 and the first photosensitive degradation group 2, and at least one second thermosensitive crosslinking group 3' is connected to a branch between the second coordinating group 1' and the first photosensitive degradation group 2.

Figure 7:
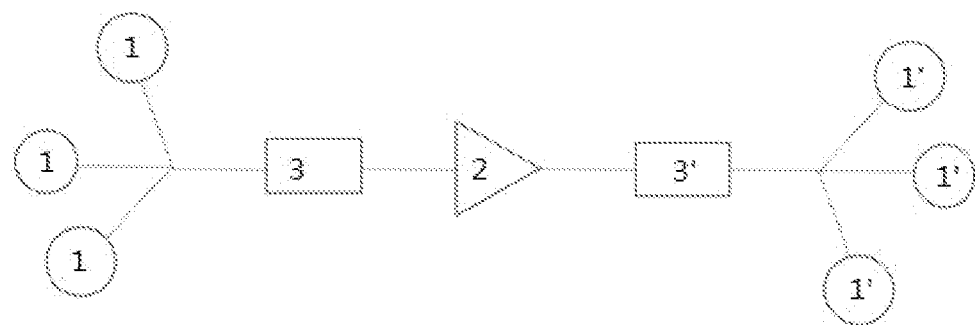
FIG. 7 is a schematic view showing the structure of a crosslinking ligand according to the seventh embodiment of the present disclosure.

FIG. 7 is an embodiment in which a plurality of first coordinating groups and a plurality of second coordinating groups are respectively arranged at both ends. As shown in FIG. 7, the crosslinking ligand includes a plurality of first coordinating groups 1 located at one end, and a first thermosensitive crosslinking group 3, a first photosensitive degradation group 2 and a second thermosensitive crosslinking group 3' that are connected in sequence, and a plurality of second coordinating groups 1' located at the other end. The plurality of first coordinating groups are all connected to the first thermosensitive crosslinking group, and the plurality of second coordinating groups are all connected to the second thermosensitive crosslinking group.

In the embodiments of the present disclosure, the first coordinating group and the second coordinating group may be the same or different, the first photosensitive degradation group and the second photosensitive degradation group may be the same or different, and the first thermosensitive crosslinking group and the second thermosensitive crosslinking group may be the same or different.

Optionally, the crosslinking ligand is a ligand represented by any one of formula (I) to formula (VII):

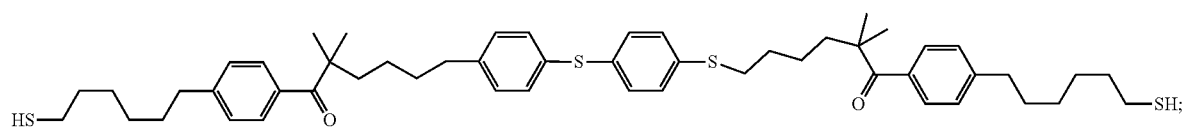

(I)

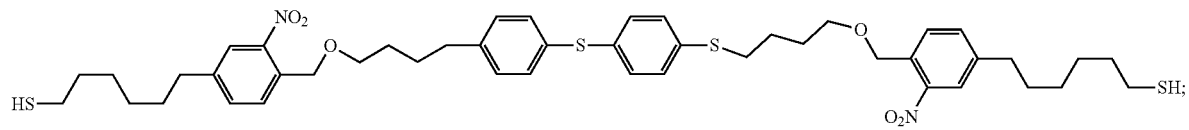

(II)

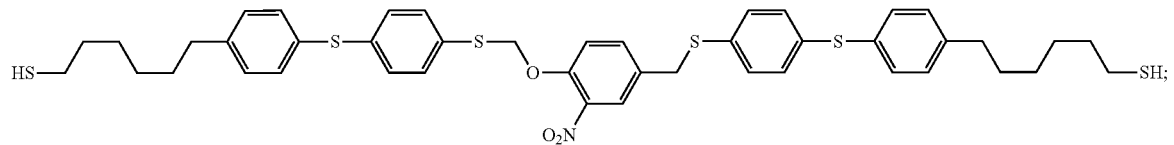

(III)

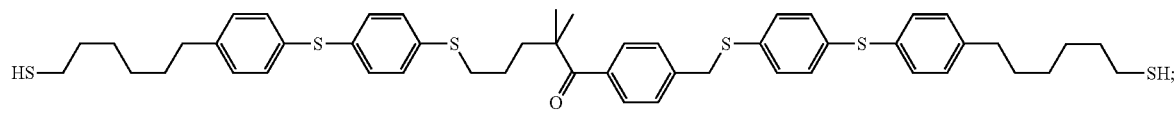

(IV)

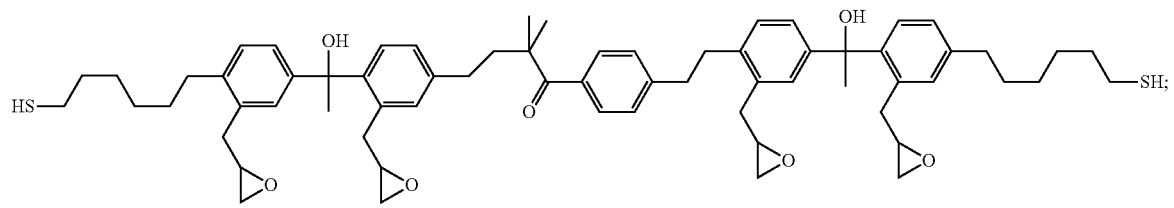

(V)

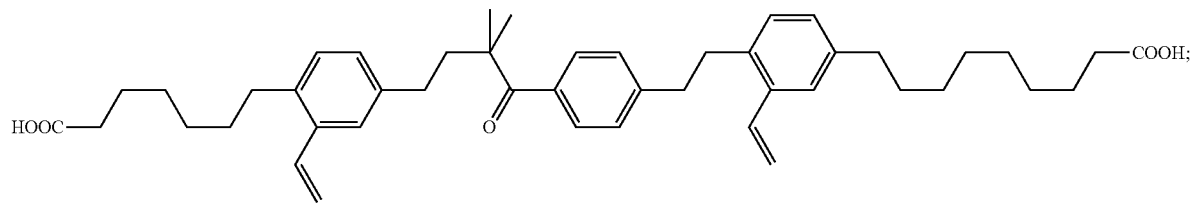

(VI)

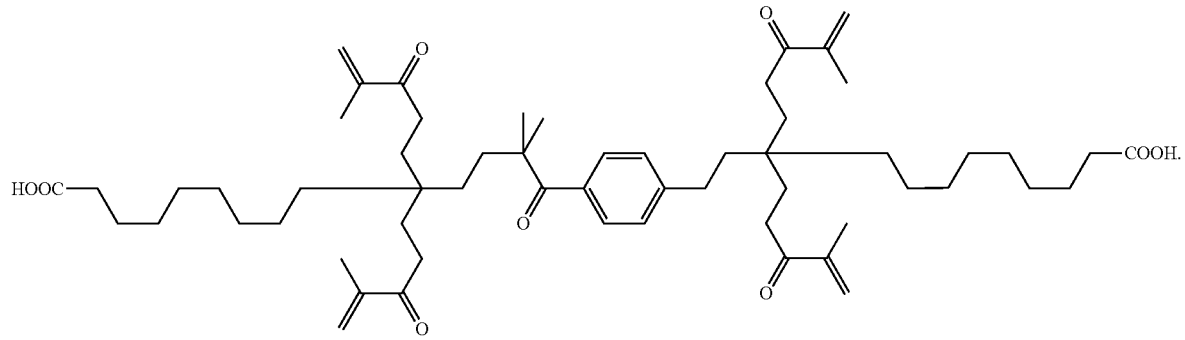

(VII)

The embodiment of the present disclosure discloses a method for patterning a nanoparticle layer, and the method includes the following steps of: S1, forming a nanoparticle layer on a substrate; S2, attaching a solution containing the crosslinking ligand described in the above technical solution to the substrate, to allow the crosslinking ligand to form a crosslinking between nanoparticles; S3, performing a light irradiation treatment on a preset region of the substrate, to degrade the crosslinking ligand in the preset region, thereby releasing the crosslinking between the nanoparticles; S4, removing the nanoparticles in the preset region; S5, performing a heat treatment on the substrate to form crosslinking between the thermosensitive crosslinking groups in the crosslinking ligands to complete the patterning of the nanoparticle layer.

Each step of patterning the nanoparticle layer will be described in detail below.

S1: forming a nanoparticle layer on a substrate. In this step, it is sufficient to use mature commercial method for forming the nanoparticle layer. For example, it can be formed by a coating and film formation process.

S2: attaching a solution containing the crosslinking ligand described in the above technical solution to the substrate, to allow the crosslinking ligand to form a crosslinking between nanoparticles. For example, a dip coating process or a coating process can be used to attach the solution of the crosslinking ligand to the substrate uniformly.

The crosslinking ligand includes at least two coordinating groups, at least one photosensitive degradation group and at least one thermosensitive crosslinking group, both of which are connected between the coordinating groups. The function of the photosensitive degradation group is to provide photosensitive characteristics, to form a patterned nanomaterial layer or quantum dot layer during exposure. The function of the thermosensitive group is to fix the pattern left after exposure, to prevent the patterned nanomaterial layer or quantum dot layer from being damaged in subsequent processes.

Optionally, the crosslinking ligand includes at least one first coordinating group and at least one second coordinating group arranged at both ends. Further optionally, a first photosensitive degradation group, a first thermosensitive crosslinking group, and a second photosensitive degradation group are sequentially connected between the first coordinating group and the second coordinating group; or a first thermosensitive crosslinking group, a first photosensitive degradation group, a second photosensitive degradation group, and a second thermosensitive crosslinking group are sequentially connected between the first coordinating group and the second coordinating group; or a first thermosensitive crosslinking group, a first photosensitive degradation group, and a second thermosensitive crosslinking group are sequentially connected between the first coordinating group and the second coordinating group; or a first photosensitive degradation group is connected between the first coordinating group and the second coordinating group, at least one first thermosensitive crosslinking group is connected to a branch between the first coordinating group and the first photosensitive degradation group, and at least one second thermosensitive crosslinking group is connected to a branch between the second coordinating group and the first photosensitive degradation group.

Optionally, the photosensitive degradation group is benzoyl, o-nitrobenzyloxy, benzyloxy acetal or coumarin group. Further optionally, the thermosensitive crosslinking group includes phenyl sulfide, epoxy, a carbon double bond-containing group, acrylate or methacrylate. Further optionally, the coordinating group includes a first coordinating group and a second coordinating group, and can be selected from any one of alkylphosphine group, alkyl oxyphosphine group, carboxyl, mercapto, and amino. The groups may be connected directly or through a carbon chain or a carbon chain containing substituents. The carbon chain may be a saturated carbon chain or an unsaturated carbon chain. The saturated carbon chain may be a linear or branched alkylene.

Optionally, the crosslinking ligand is a ligand represented by any one of the following formula (I) to formula (VII):

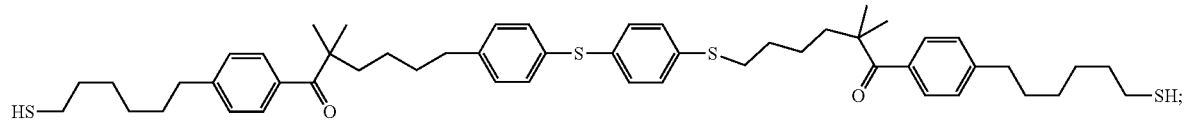

(I)

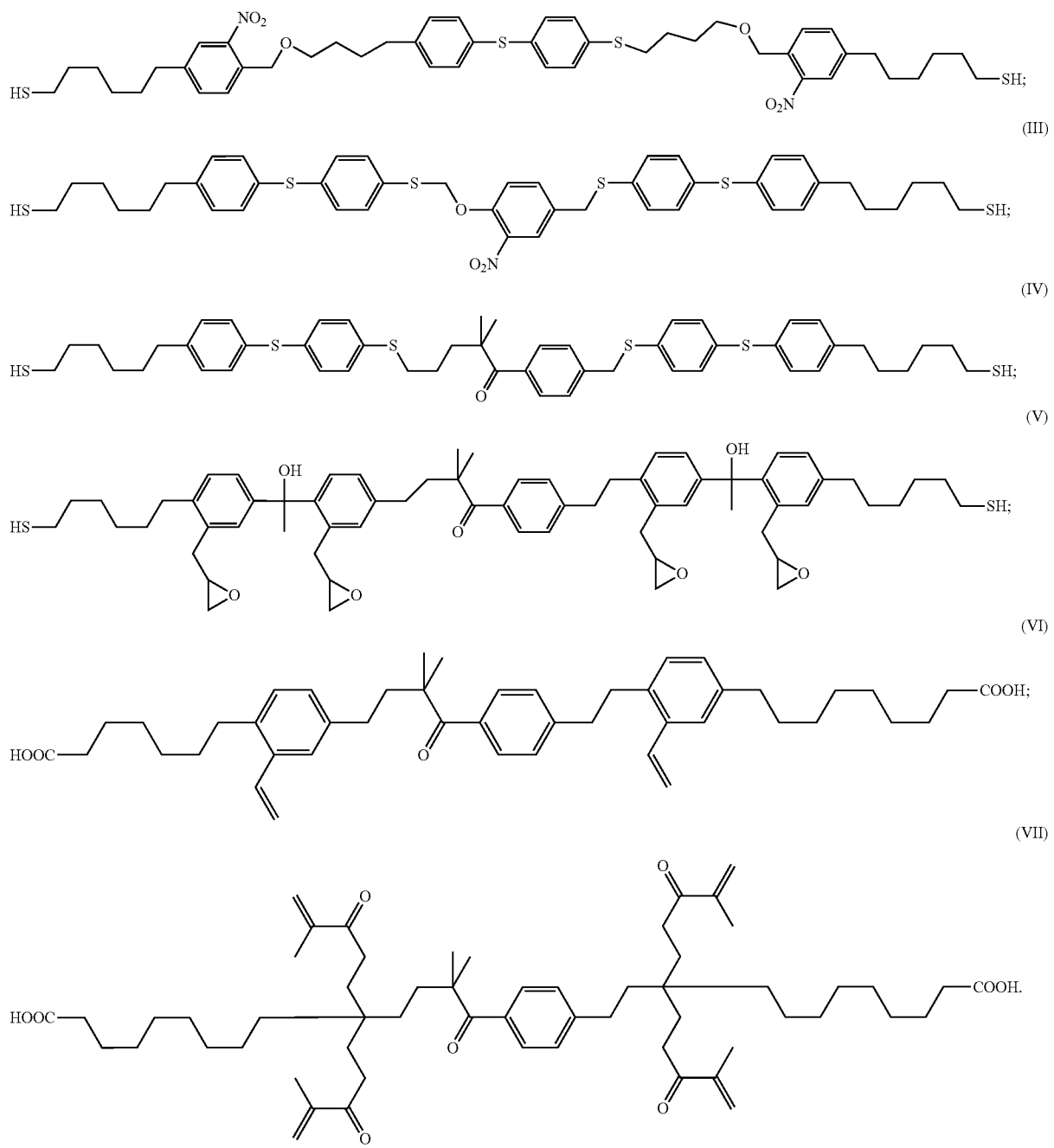

The coating method or the immersion method can be used to attach the solution containing the crosslinking ligand to the substrate uniformly. Since the crosslinking ligand contains at least two coordinating groups, the nanoparticle crosslinking are formed between them.

S3: performing a light irradiation treatment on a preset region of the substrate, to degrade the crosslinking ligand in the preset region, thereby releasing the crosslinking between the nanoparticles.

The preset region is a region where light irradiation needs to be applied. Through the light irradiation treatment, the crosslinking ligand in the preset region is degraded, resulting in a de-crosslinking between the nanoparticles. The degradation of the crosslinking ligand refers to the cleavage of the photosensitive group therein. The light that can be used in the light irradiation treatment has a wavelength in a range from 300 to 400 nm.

S4: removing the nanoparticles in the preset region.

Optionally, the nanoparticles in the preset region are removed by solvent elution. The solvent used is a good solvent for nanoparticles, for example, n-hexane, n-heptane, n-octane, toluene, chlorobenzene, dichlorobenzene, xylene, tetrahydrofuran, etc.

S5: perform a heat treatment on the substrate to form crosslinking between the thermosensitive crosslinking groups in the crosslinking ligands to complete the patterning of the nanoparticle layer.

The heat treatment is performed at a temperature in a range from 100 to 150° C., and the heat treatment is performed for a time period in a range from 10 to 30 min. After the heat treatment, a crosslinking is formed between the thermosensitive crosslinking groups in the crosslinking ligand, and the solubility of the crosslinking nanoparticles is reduced, so that they are firmly fixed on the substrate. When a solvent is used to remove the nanoparticles, the nanoparticles are difficult to be eluted. If the second type of nanoparticle layer is formed, the heat treatment can also effectively prevent the second type of nanoparticle layer from affecting the former type of nanoparticle layer during the patterning process of the second type of nanoparticle layer.

The nanoparticles in the present disclosure may be quantum dots, and the nanoparticle layer may be a quantum dot layer. The above steps S1 to S5 are repeated to form a plurality of quantum dot layers on the substrate. The plurality of quantum dot layers may be quantum dot layers capable of emitting light of different colors, for example, red, green, and blue quantum dot layers.

If quantum dot layers emitting light of two different colors are formed, the method for patterning nanoparticle layer according to the embodiment of the present disclosure may include the following steps of:

S1-1: forming a first quantum dot layer on the substrate;

S2-1: attaching a solution containing the crosslinking ligand described in the above technical solution to the substrate, to allow the crosslinking ligand to form a crosslinking between the first quantum dots;

S3-1: performing a light irradiation treatment on a preset region of the substrate, to degrade the crosslinking ligand in the preset region, thereby releasing the crosslinking between the first quantum dots;

S4-1: removing the first quantum dot in the preset region;

S5-1: performing a heat treatment on the substrate, to form a crosslinking between the thermosensitive crosslinking groups in the crosslinking ligands, thereby completing the patterning of the first quantum dot layer;

S1-2: forming a second quantum dot layer on the substrate;

S2-2: attaching a solution containing the crosslinking ligand described in the above technical solution to the substrate, to allow the crosslinking ligand to form a crosslinking between the second quantum dots;

S3-2: performing a light irradiation treatment on a preset region of the substrate, to degrade the crosslinking ligand in the preset region, thereby releasing the crosslinking between the second quantum dots;

S4-2: removing the second quantum dot in the preset region;

S5-2: performing a heat treatment on the substrate, to form a crosslinking between the thermosensitive crosslinking groups in the crosslinking ligands, thereby completing the patterning of the second quantum dot layer; in which the color of the light emitted by the first quantum dot after being excited is different from the color of the light emitted by the second quantum dot after being excited.

If quantum dot layers emitting light of three different colors are formed, the method for patterning nanoparticle layer according to the embodiment of the present disclosure may include the following steps of:

S1-1: forming a first quantum dot layer on the substrate;

S2-1: attaching a solution containing the crosslinking ligand described in the above technical solution to the substrate, to allow the crosslinking ligand to form a crosslinking between the first quantum dots;

S3-1: performing a light irradiation treatment on a preset region of the substrate, to degrade the crosslinking ligand in the preset region, thereby releasing the crosslinking between the first quantum dots;

S4-1: removing the first quantum dot in the preset region;

S5-1: performing a heat treatment on the substrate, to form a crosslinking between the thermosensitive crosslinking groups in the crosslinking ligands, thereby completing the patterning of the first quantum dot layer;

S1-2: forming a second quantum dot layer on the substrate;

S2-2: attaching a solution containing the crosslinking ligand described in the above technical solution to the substrate, to allow the crosslinking ligand to form a crosslinking between the second quantum dots;

S3-2: performing a light irradiation treatment on a preset region of the substrate, to degrade the crosslinking ligand in the preset region, thereby releasing the crosslinking between the second quantum dots;

S4-2: removing the second quantum dot in the preset region;

S5-2: performing a heat treatment on the substrate, to form a crosslinking between the thermosensitive crosslinking groups in the crosslinking ligands, thereby completing the patterning of the second quantum dot layer;

S1-3: forming a third quantum dot layer on the substrate;

S2-3: attaching a solution containing the crosslinking ligand described in the above technical solution to the substrate, to allow the crosslinking ligand to form a crosslinking between the third quantum dots;

S3-3: performing a light irradiation treatment on a preset region of the substrate, to degrade the crosslinking ligand in the preset region, thereby releasing the crosslinking between the third quantum dots;

S4-3: removing the third quantum dot in the preset region;

S5-3: performing a heat treatment on the substrate, to form a crosslinking between the thermosensitive crosslinking groups in the crosslinking ligands, thereby completing the patterning of the third quantum dot layer; in which the colors of the light emitted by the first quantum dot, the second quantum dot, and the third quantum dot after being excited are all different.

The embodiment of the present disclosure discloses a method for preparing a quantum dot light-emitting device, including forming an anode, a quantum dot layer, and a cathode, in which the quantum dot layer is prepared by the above method for patterning nanoparticle layer.

Optionally, the method for preparing the quantum dot light-emitting device is a method for preparing a quantum dot light emitting diode (QLED) device, and the method specifically includes: forming an anode on a substrate; forming a hole injection layer (for example, poly-3,4-ethylenedioxythiophene/polystyrene sulfonate (PEDOT: PSS) on the anode; forming a hole transport layer (for example, polyvinylcarbazole (PVK), [9,9-dioctylfluorene-co-N-[4-(3-methylpropyl)]-diphenylamine] (TFB)) on the hole injection layer; forming a quantum dot layer on the hole transport layer; attaching the solution containing the crosslinking ligand described in the above technical solution to the anode, to allow the crosslinking ligand to form a crosslinking between quantum dots; performing a light irradiation treatment on a preset region of the substrate, to degrade the crosslinking ligand in the preset region, thereby releasing the crosslinking between the quantum dots; removing the nanoparticles in the preset region; performing a heat treatment on the substrate formed with the anode, to form a crosslinking between the thermosensitive crosslinking groups in the crosslinking ligands, thereby completing the patterning of the quantum dot layer; forming an electron transport layer on the quantum dot layer; and forming a cathode on the electron transport layer.

The embodiment of the present disclosure also discloses a quantum dot light-emitting device prepared by the above method for preparing a quantum dot light-emitting device.

An embodiment of the present disclosure also discloses a display device, including the quantum dot light-emitting device of the above technical solutions.

In order to further understand the technical solutions of the present disclosure, the method for patterning the nanoparticle layer, the quantum dot light-emitting device, and the display device provided by the present disclosure will be described in detail below in conjunction with the following Examples, and the protection scope of the present disclosure is not limited by the following Examples.

Example 1

Figures 8, 9:
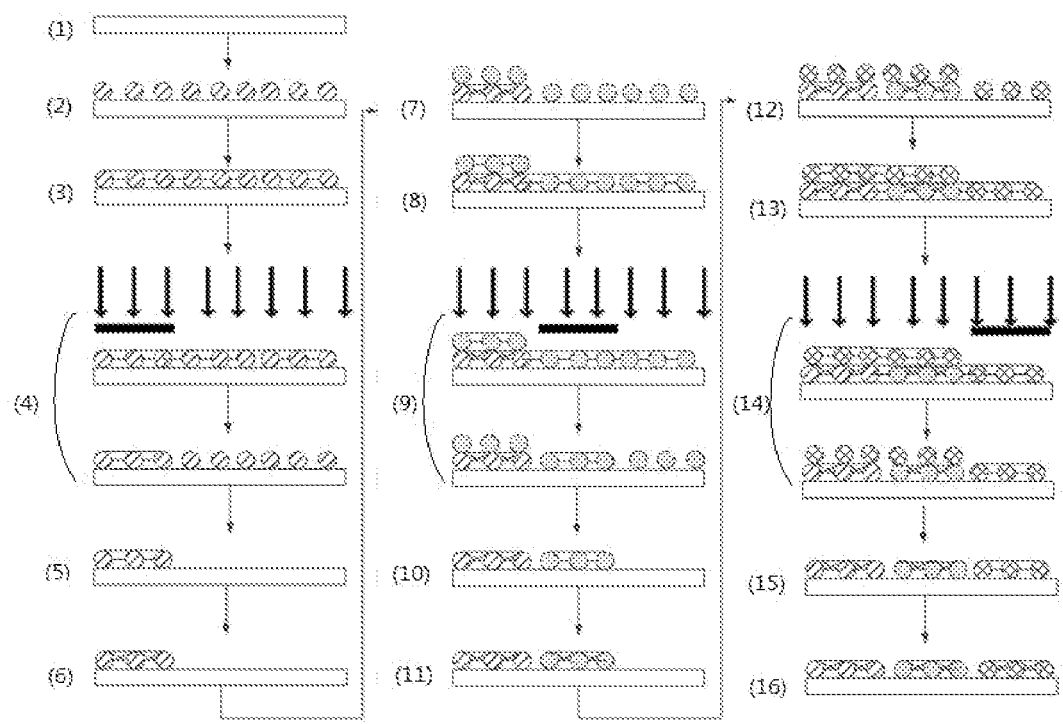
FIG. 8 is a flow chart schematic view showing a method for preparing a flexible display panel according to an embodiment of the present disclosure.
FIG. 9 shows the quantum dots represented by different graphs in FIG. 8.

As for the flow of the method for patterning quantum dots of this embodiment, refer to FIG. 8 for details. FIG. 9 shows the quantum dots represented by different graphs in FIG. 8. Specifically, the quantum dot layer of Example 1 was prepared according to the following steps of:
(1) cleaning a substrate;
(2) coating red quantum dots on the substrate to form a red quantum dot layer;
(3) choosing the crosslinking ligand shown in formula (I):

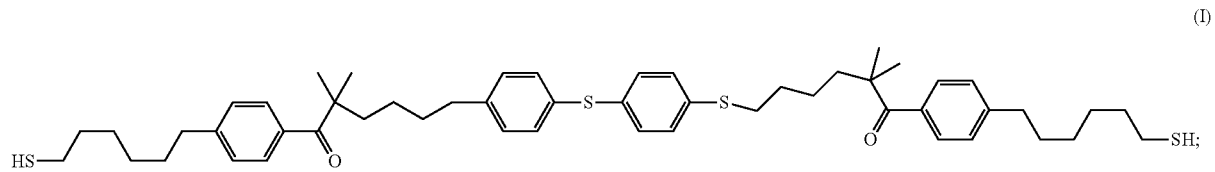 [SMILES: CC(C)(CCCCSc1ccc(Sc2ccc(CCCCC(C)(C)C(=O)c3ccc(CCCCCCS)cc3)cc2)cc1)C(=O)c1ccc(CCCCCCS)cc1]

(I)

coating the solution containing the crosslinking ligand represented by formula (I) on the substrate uniformly, to form a crosslinking between the red quantum dots;
(4) performing an exposure processing on the preset region with light having a wavelength of 300 nanometers, the crosslinking ligand in the exposed region is degraded, so that the red quantum dots are de-crosslinked, but the red quantum dots in the unexposed region are still cross-linked;
(5) washing away the de-crosslinked red quantum dots in the exposed region by using a quantum dot good solvent;
(6) thermally crosslinking the red quantum dot layer in the unexposed region by heating treatment at a temperature in a range from 100 to 150° C.;
(7) coating green quantum dots on the substrate, to form a green quantum dot layer;
(8) coating the solution containing the crosslinking ligand represented by formula (I) on the substrate uniformly, to form a crosslinking between the green quantum dots;
(9) performing an exposure processing on the preset region with light having a wavelength of 300 nanometers, the crosslinking ligand in the exposed region is degraded, so that the green quantum dots are de-crosslinked, but the green quantum dots in the unexposed region are still cross-linked;
(10) washing away the de-crosslinked green quantum dots in the exposed region by using a quantum dot good solvent;
(11) thermally crosslinking the green quantum dot layer in the unexposed region by heating treatment at a temperature in a range from 100 to 150° C.;
(12) coating blue quantum dots on the substrate, to form a blue quantum dot layer;
(13) coating the solution containing the crosslinking ligand represented by formula (I) on the substrate uniformly, to form a crosslinking between the blue quantum dots;
(14) performing an exposure processing on the preset region with light having a wavelength of 300 nanometers, the crosslinking ligand in the exposed region is degraded, so that the blue quantum dots are de-crosslinked, but the blue quantum dots in the unexposed region are still cross-linked;
(15) washing away the de-crosslinked blue quantum dots in the exposed region by using a quantum dot good solvent;
(16) thermally crosslinking the blue quantum dot layer in the unexposed region by heating treatment at a temperature in a range from 100 to 150° C.;

After the above steps, the patterning of the R/G/B quantum dot layer is realized, thereby preparing the R/G/B quantum dot layer.

Example 2

The light-emitting device of Example 2 was prepared according to the following steps of:
(1) cleaning a TFT substrate;
(2) coating a hole injection layer (PEDOT: PSS) and a hole transport layer (polyvinylcarbazole (PVK)) on the TFT substrate in sequence;
(3) coating red quantum dots on the hole transport layer, to form a red quantum dot layer;
(4) choosing the crosslinking ligand shown in formula (I):

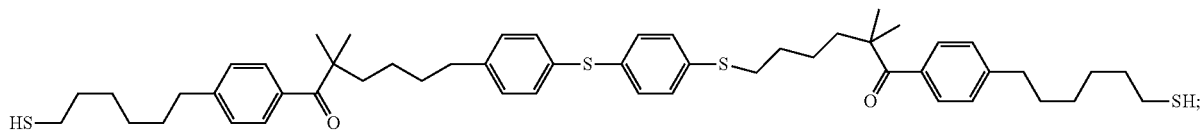
(I)

coating the solution containing the crosslinking ligand represented by formula (I) on the substrate, to form a crosslinking between the red quantum dots;

(5) performing an exposure processing on the preset region with light having a wavelength of 300 nanometers, the crosslinking ligand in the exposed region is degraded, so that the red quantum dots are de-crosslinked, but the red quantum dots in the unexposed region are still cross-linked;

(6) washing away the de-crosslinked red quantum dots in the exposed region by using a quantum dot good solvent (xylene);

(7) thermally crosslinking the red quantum dot layer in the unexposed region by heating treatment at a temperature in a range from 100 to 150° C.;

(8) coating green quantum dots on the substrate, to form a green quantum dot layer;

(9) coating the solution containing the crosslinking ligand represented by formula (I) on the substrate uniformly, to form a crosslinking between the green quantum dots;

(10) performing an exposure processing on the preset region with light having a wavelength of 300 nanometers, the crosslinking ligand in the exposed region is degraded, so that the green quantum dots are de-crosslinked, but the green quantum dots in the unexposed region are still cross-linked;

(11) washing away the de-crosslinked green quantum dots in the exposed region by using a quantum dot good solvent;

(12) thermally crosslinking the green quantum dot layer in the unexposed region by heating treatment at a temperature in a range from 100 to 150° C.;

(13) coating blue quantum dots on the substrate, to form a blue quantum dot layer;

(14) coating the solution containing the crosslinking ligand represented by formula (I) on the substrate uniformly, to form a crosslinking between the blue quantum dots;

(15) performing an exposure processing on the preset region with light having a wavelength of 300 nanometers, the crosslinking ligand in the exposed region is degraded, so that the blue quantum dots are de-crosslinked, but the blue quantum dots in the unexposed region are still cross-linked;

(16) washing away the de-crosslinked blue quantum dots in the exposed region by using a quantum dot good solvent;

(17) thermally crosslinking the blue quantum dot layer in the unexposed region by heating treatment at a temperature in a range from 100 to 150° C., so as to realize the patterning of the R/G/B quantum dot layer;

(18) coating ZnO nanoparticle layer;

(19) evaporating Al metal as the cathode;

(20) encapsulating to obtain a quantum dot light-emitting device.

Example 3

The quantum dot layer of Example 3 was prepared according to the following steps of:

(1) cleaning a substrate;

(2) coating red quantum dots on the substrate to form a red quantum dot layer;

(3) choosing the crosslinking ligand shown in formula (III):

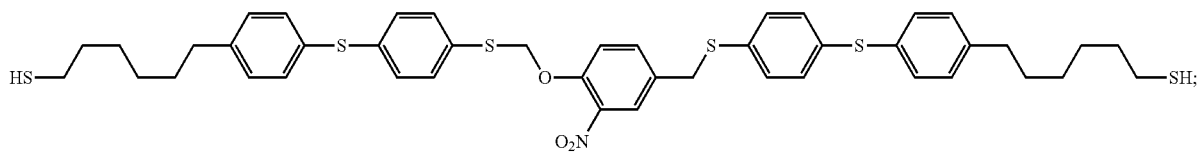
(III)

coating the solution containing the crosslinking ligand represented by formula (III) on the substrate uniformly, to form a crosslinking between the red quantum dots;

(4) performing an exposure processing on the preset region with light having a wavelength of 308 nanometers, the crosslinking ligand in the exposed region is degraded, so that the red quantum dots are de-crosslinked, but the red quantum dots in the unexposed region are still cross-linked;

(5) washing away the de-crosslinked red quantum dots in the exposed region by using a quantum dot good solvent;

(6) thermally crosslinking the red quantum dot layer in the unexposed region by heating treatment at a temperature in a range from 100 to 150° C.;

(7) coating green quantum dots on the substrate, to form a green quantum dot layer;

(8) coating the solution containing the crosslinking ligand represented by formula (III) on the substrate uniformly, to form a crosslinking between the green quantum dots;

(9) performing an exposure processing on the preset region with light having a wavelength of 308 nanometers, the crosslinking ligand in the exposed region is degraded, so that the green quantum dots are de-crosslinked, but the green quantum dots in the unexposed region are still cross-linked;

(10) washing away the de-crosslinked green quantum dots in the exposed region by using a quantum dot good solvent;

(11) thermally crosslinking the green quantum dot layer in the unexposed region by heating treatment at a temperature in a range from 100 to 150° C.;

(12) coating blue quantum dots on the substrate, to form a blue quantum dot layer;

(13) coating the solution containing the crosslinking ligand represented by formula (III) on the substrate uniformly, to form a crosslinking between the blue quantum dots;

(14) performing an exposure processing on the preset region with light having a wavelength of 308 nanometers, the crosslinking ligand in the exposed region is degraded, so that the blue quantum dots are de-crosslinked, but the blue quantum dots in the unexposed region are still cross-linked;

(15) washing away the de-crosslinked blue quantum dots in the exposed region by using a quantum dot good solvent;

(16) thermally crosslinking the blue quantum dot layer in the unexposed region by heating treatment at a temperature in a range from 100 to 150° C.;

After the above steps, the patterning of the R/G/B quantum dot layer is realized, thereby preparing the R/G/B quantum dot layer.

Example 4

According to the steps in the method of above Example 2, a light-emitting device including the quantum dot layer of Example 3 is prepared in similar manner.

Example 5

The quantum dot layer of Example 5 was prepared according to the following steps of:

(1) cleaning a substrate;

(2) coating red quantum dots on the substrate to form a red quantum dot layer;

(3) choosing the crosslinking ligand shown in formula (VII):

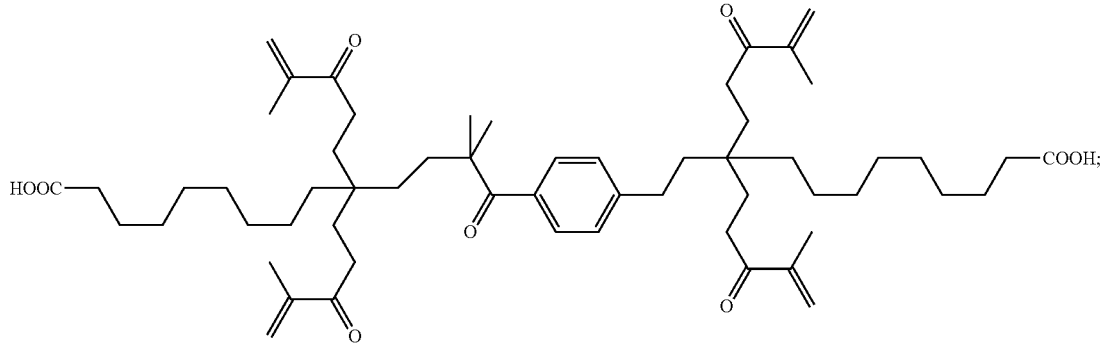

coating the solution containing the crosslinking ligand represented by formula (VII) on the substrate uniformly, to form a crosslinking between the red quantum dots;

(4) performing an exposure processing on the preset region with light having a wavelength of 300 nanometers, the crosslinking ligand in the exposed region is degraded, so that the red quantum dots are de-crosslinked, but the red quantum dots in the unexposed region are still cross-linked;

(5) washing away the de-crosslinked red quantum dots in the exposed region by using a quantum dot good solvent;

(6) thermally crosslinking the red quantum dot layer in the unexposed region by heating treatment at a temperature in a range from 100 to 150° C.;

(7) coating green quantum dots on the substrate, to form a green quantum dot layer;

(8) coating the solution containing the crosslinking ligand represented by formula (VII) on the substrate uniformly, to form a crosslinking between the green quantum dots;

(9) performing an exposure processing on the preset region with light having a wavelength of 300 nanometers, the crosslinking ligand in the exposed region is degraded, so that the green quantum dots are de-crosslinked, but the green quantum dots in the unexposed region are still cross-linked;

(10) washing away the de-crosslinked green quantum dots in the exposed region by using a quantum dot good solvent;

(11) thermally crosslinking the green quantum dot layer in the unexposed region by heating treatment at a temperature in a range from 100 to 150° C.;

(12) coating blue quantum dots on the substrate, to form a blue quantum dot layer;

(13) coating the solution containing the crosslinking ligand represented by formula (VII) on the substrate uniformly, to form a crosslinking between the blue quantum dots;

(14) performing an exposure processing on the preset region with light having a wavelength of 300 nanometers, the crosslinking ligand in the exposed region is degraded, so that the blue quantum dots are de-crosslinked, but the blue quantum dots in the unexposed region are still cross-linked;

(15) washing away the de-crosslinked blue quantum dots in the exposed region by using a quantum dot good solvent;

(16) thermally crosslinking the blue quantum dot layer in the unexposed region by heating treatment at a temperature in a range from 100 to 150° C.;

After the above steps, the patterning of the R/G/B quantum dot layer is realized, thereby preparing the R/G/B quantum dot layer.

Example 6

According to the steps in the method of above Example 2, a light-emitting device including the quantum dot layer of Example 5 is prepared in similar manner.

It was shown by tests that the quantum dot layers prepared in Examples 1, 3, and 5 and the light-emitting devices prepared in Examples 2, 4, and 6 all have a resolution of 500 ppi (that is, the sub-pixel size is 5×39 microns, and the color gamut is up to 110% NTSC). This indicates that a quantum dot layer or light-emitting device with a resolution greater than 300 ppi can be prepared by the crosslinking ligand or patterning method of the present invention.

The description of the above Examples is merely used for helping to understand the method according to the present disclosure and its inventive concept. The above description of the disclosed Examples allows a skilled person in the art to implement or use the present disclosure. Without departing from the spirit or scope of the present disclosure, several improvements and modifications can be made to the present disclosure, and these improvements and modifications also fall within the protection scope of the claims of the present disclosure. Therefore, the present disclosure will not be limited to the Examples shown herein, but should conform to the widest scope consistent with the principles and novel features disclosed herein.

What is claimed is:

1. A crosslinking ligand, comprising at least two coordinating groups, at least one photosensitive degradation group and at least one thermosensitive crosslinking group, both of which are connected between the coordinating groups, wherein the photosensitive degradation group comprises o-nitrobenzyloxy, or benzyloxy acetal; the thermosensitive crosslinking group comprises phenyl sulfide or epoxy.

2. The crosslinking ligand of claim 1, wherein the crosslinking ligand comprises at least one first coordinating group and at least one second coordinating group arranged at both ends, and wherein a first photosensitive degradation group, a first thermosensitive crosslinking group, and a second photosensitive degradation group are sequentially connected between the first coordinating group and the second coordinating group;

a first thermosensitive crosslinking group, a first photosensitive degradation group, a second photosensitive degradation group, and a second thermosensitive crosslinking group are sequentially connected between the first coordinating group and the second coordinating group;

a first thermosensitive crosslinking group, a first photosensitive degradation group, and a second thermosensitive crosslinking group are sequentially connected between the first coordinating group and the second coordinating group; or a first photosensitive degradation group is connected between the first coordinating group and the second coordinating group, at least one first thermosensitive crosslinking group is connected to a branch between the first coordinating group and the first photosensitive degradation group, and at least one second thermosensitive crosslinking group is connected to a branch between the second coordinating group and the first photosensitive degradation group.

3. The crosslinking ligand of claim 1, wherein the coordinating groups are selected from any one of alkylphosphine group, alkyl oxyphosphine group, carboxyl, mercapto, and amino.

4. The crosslinking ligand of claim 1, wherein the crosslinking ligand is a ligand represented by any one of formula (I) to formula (VII):

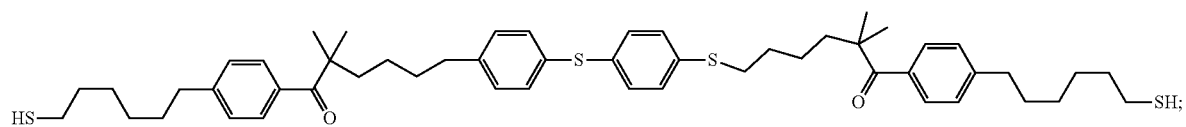
(I)
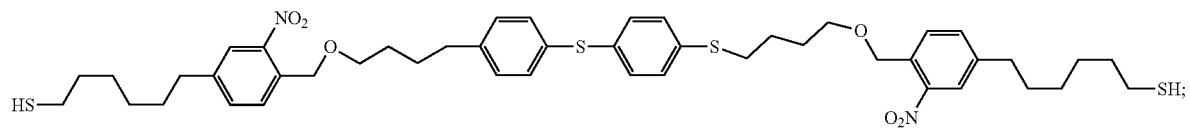
(II)
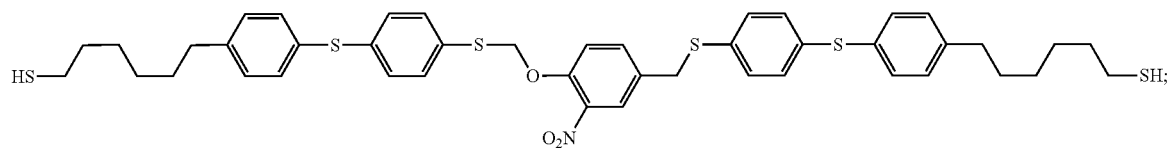
(III)
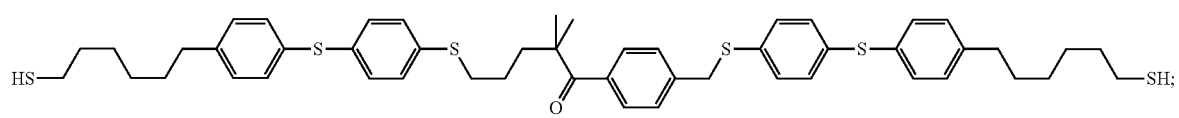
(IV)
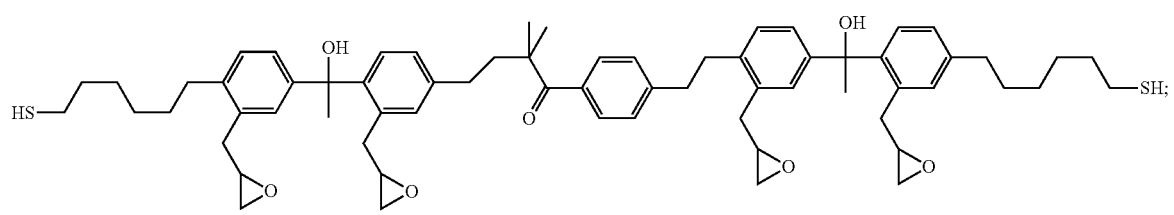
(V)
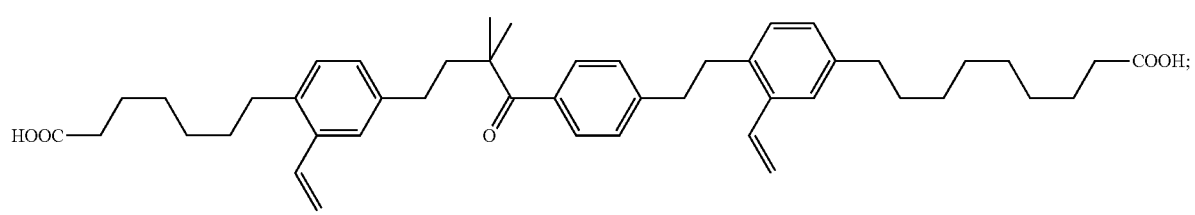
(VI)
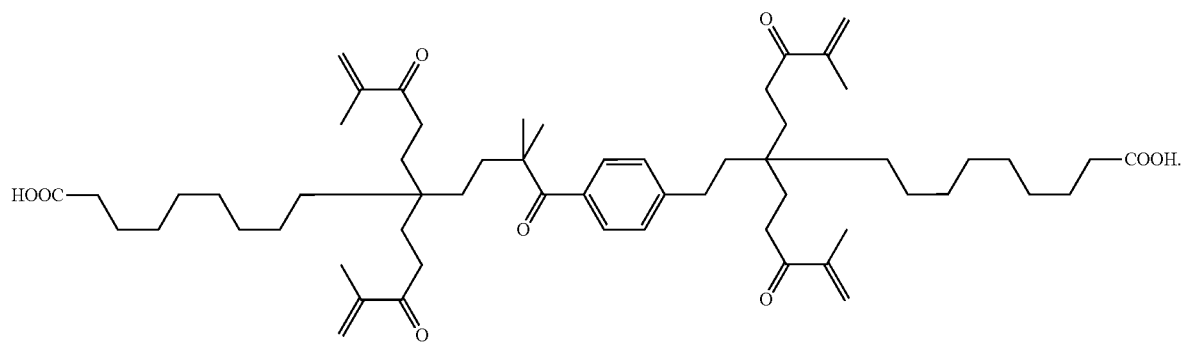
(VII)

5. A method for patterning a nanoparticle layer, comprising steps of:
forming a nanoparticle layer on a substrate;
attaching a solution containing the crosslinking ligand of claim 1 to the substrate, to allow the crosslinking ligand to form a crosslinking between nanoparticles;
performing a light irradiation treatment on a preset region of the substrate, to degrade the crosslinking ligand in the preset region, thereby releasing the crosslinking between the nanoparticles;
removing the nanoparticles in the preset region; and
performing a heat treatment on the substrate, to form a crosslinking between the thermosensitive crosslinking groups in the crosslinking ligands, thereby completing the patterning of the nanoparticle layer.

6. The method of claim 5, wherein the nanoparticle layer is a quantum dot layer.

7. The method of claim 6, wherein the steps are repeated to form a plurality of quantum dot layers capable of emitting light of different colors on the substrate.

8. The method of claim 5, wherein the light used in the light irradiation treatment has a wavelength in a range from 300 to 400 nm; and the heat treatment is performed at a temperature in a range from 100 to 150° C., and the heat treatment is performed for a time period in a range from 10 to 30 min.

9. A method for preparing a quantum dot light-emitting device, comprising forming an anode, a nanoparticle layer and a cathode, wherein the nanoparticle layer is prepared by the method of claim 5.

10. A quantum dot light-emitting device prepared by the method for preparing the quantum dot light-emitting device of claim 9.

11. A display device, comprising the quantum dot light-emitting device of claim 10.

12. The method of claim 5, wherein the crosslinking ligand comprises at least one first coordinating group and at least one second coordinating group arranged at both ends, and
wherein a first photosensitive degradation group, a first thermosensitive crosslinking group, and a second photosensitive degradation group are sequentially connected between the first coordinating group and the second coordinating group;
a first thermosensitive crosslinking group, a first photosensitive degradation group, a second photosensitive degradation group, and a second thermosensitive crosslinking group are sequentially connected between the first coordinating group and the second coordinating group;
a first thermosensitive crosslinking group, a first photosensitive degradation group, and a second thermosensitive crosslinking group are sequentially connected between the first coordinating group and the second coordinating group; or
a first photosensitive degradation group is connected between the first coordinating group and the second coordinating group, at least one first thermosensitive crosslinking group is connected to a branch between the first coordinating group and the first photosensitive degradation group, and at least one second thermosensitive crosslinking group is connected to a branch between the second coordinating group and the first photosensitive degradation group.

13. The method of claim 5, wherein the coordinating groups are selected from any one of alkylphosphine group, alkyl oxyphosphine group, carboxyl, mercapto, and amino.

14. The method of claim 5, wherein the crosslinking ligand is a ligand represented by any one of formula (I) to formula (VII):

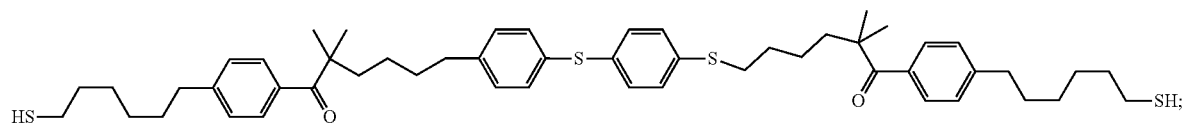

(I)

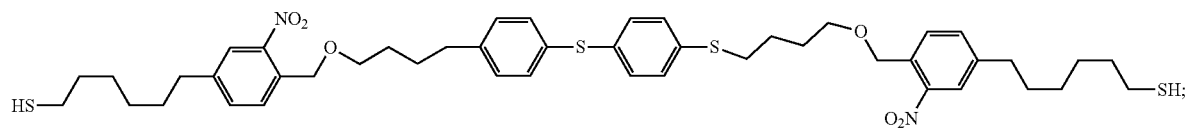

(II)

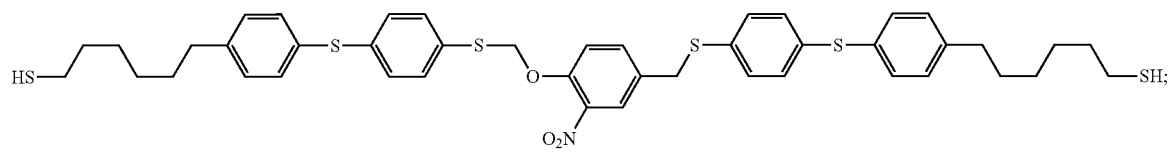

(III)

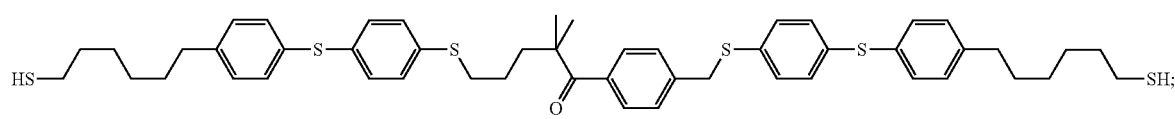

(IV)

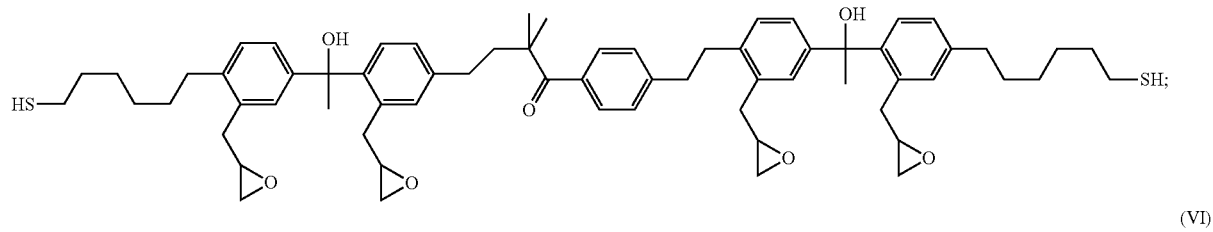

(V)

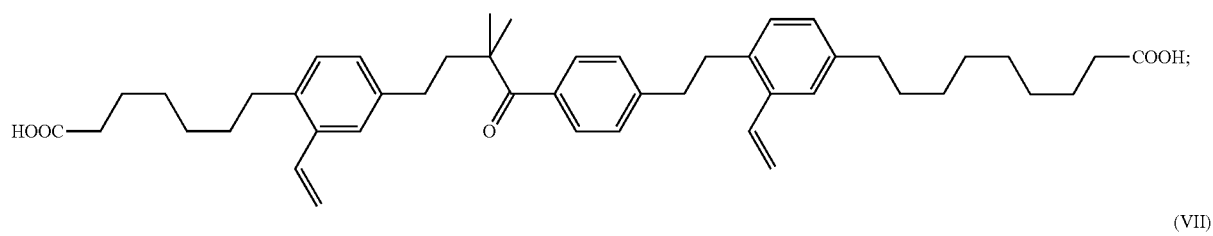

(VI)

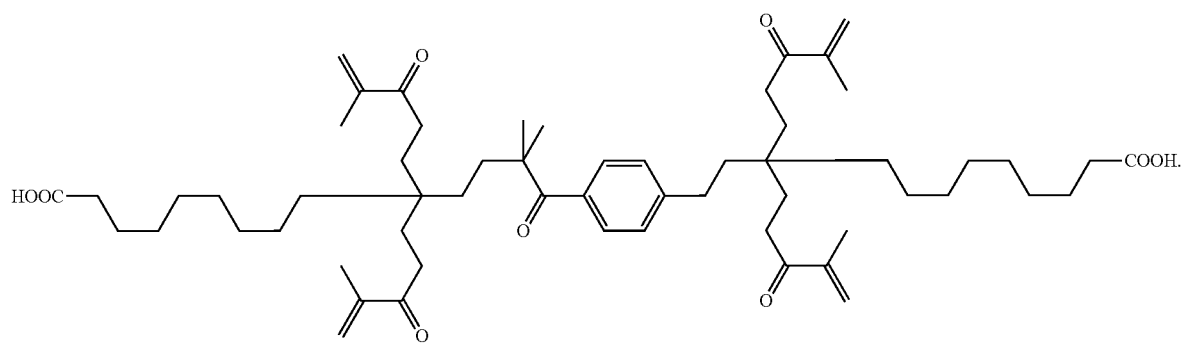

(VII)

15. The method of claim 9, wherein the steps are repeated to form a plurality of nanoparticle layers capable of emitting light of different colors on the substrate.

16. The method of claim 9, wherein the light used in the light irradiation treatment has a wavelength in a range from 300 to 400 nm; and the heat treatment is performed at a temperature in a range from 100 to 150° C., and the heat treatment is performed for a time period in a range from 10 to 30 min.

17. The method of claim 9, wherein the crosslinking ligand comprises at least one first coordinating group and at least one second coordinating group arranged at both ends, and wherein a first photosensitive degradation group, a first thermosensitive crosslinking group, and a second photosensitive degradation group are sequentially connected between the first coordinating group and the second coordinating group;

a first thermosensitive crosslinking group, a first photosensitive degradation group, a second photosensitive degradation group, and a second thermosensitive crosslinking group are sequentially connected between the first coordinating group and the second coordinating group;

a first thermosensitive crosslinking group, a first photosensitive degradation group, and a second thermosensitive crosslinking group are sequentially connected between the first coordinating group and the second coordinating group; or a first photosensitive degradation group is connected between the first coordinating group and the second coordinating group, at least one first thermosensitive crosslinking group is connected to a branch between the first coordinating group and the first photosensitive degradation group, and at least one second thermosensitive crosslinking group is connected to a branch between the second coordinating group and the first photosensitive degradation group.

18. The method of claim 9, wherein the coordinating groups are selected from any one of alkylphosphine group, alkyl oxyphosphine group, carboxyl, mercapto, and amino.

19. The method of claim 9, wherein the crosslinking ligand is a ligand represented by any one of formula (I) to formula (VII):

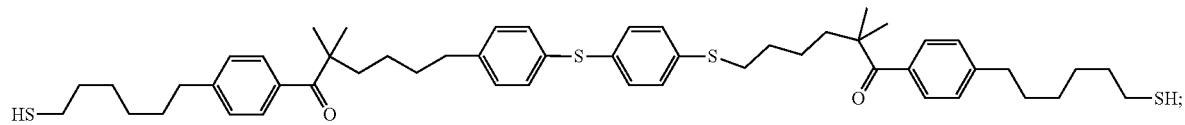

(I)

-continued
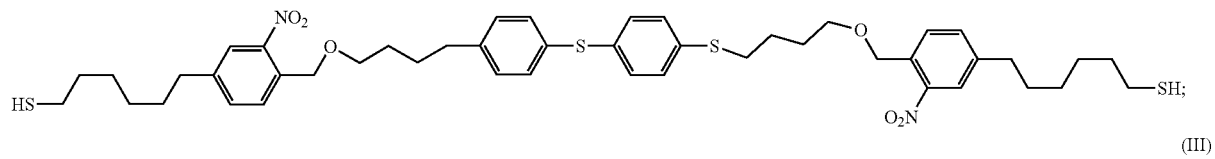
(II)
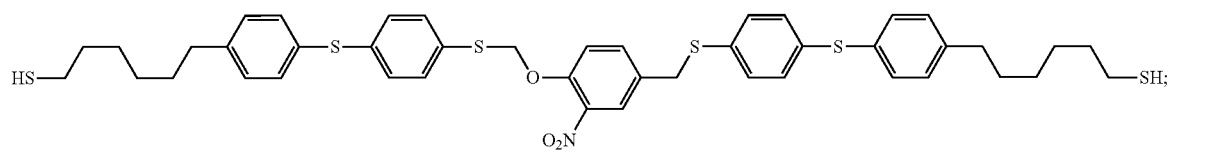
(III)
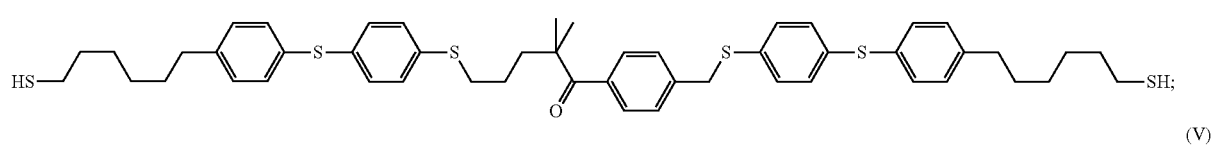
(IV)
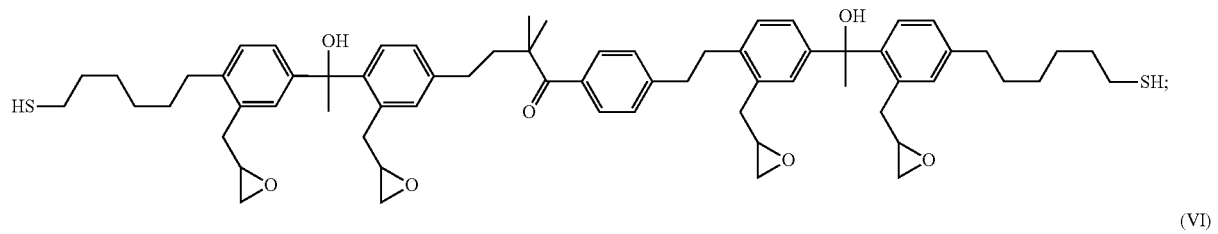
(V)
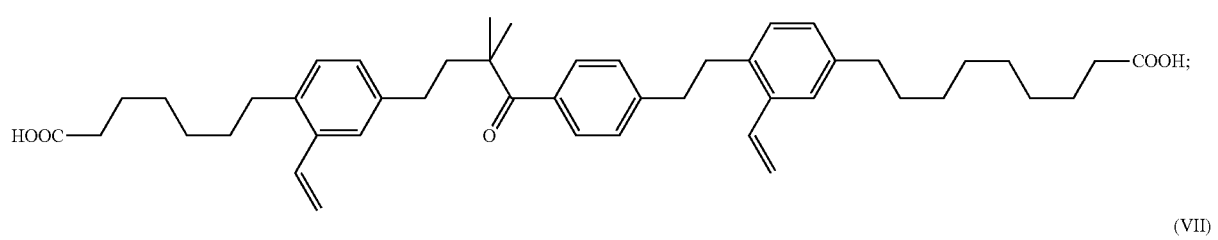
(VI)
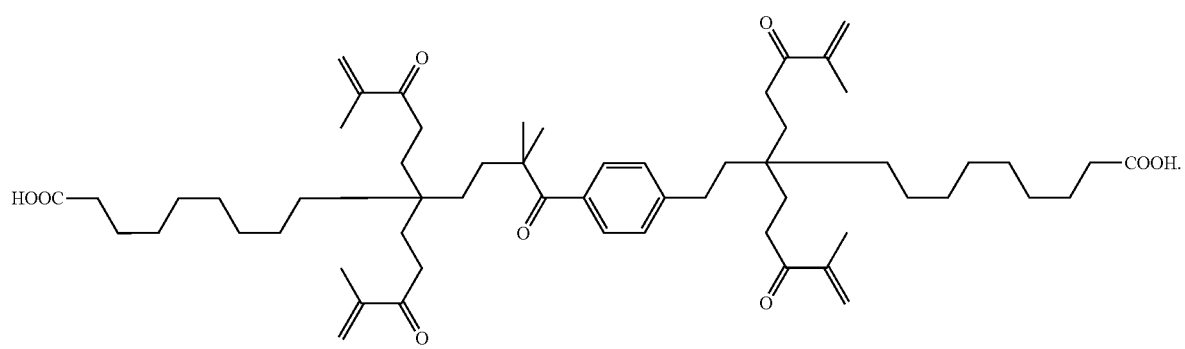
(VII)
* * * * *

UNITED STATES PATENT AND TRADEMARK OFFICE
CERTIFICATE OF CORRECTION

PATENT NO. : 12,441,697 B2
APPLICATION NO. : 17/429931
DATED : October 14, 2025
INVENTOR(S) : Zhuo Chen Page 1 of 1

It is certified that error appears in the above-identified patent and that said Letters Patent is hereby corrected as shown below:

On the Title Page

Item (30) should read:
Feb. 21, 2020 (CN) ............................ 202010106719.9

Signed and Sealed this
Ninth Day of December, 2025

John A. Squires
*Director of the United States Patent and Trademark Office*